United States Patent
Lee et al.

(10) Patent No.: US 11,922,996 B2
(45) Date of Patent: Mar. 5, 2024

(54) APPARATUSES, SYSTEMS, AND METHODS FOR ZQ CALIBRATION

(71) Applicant: MICRON TECHNOLOGY, INC., Boise, ID (US)

(72) Inventors: Hyunui Lee, Gyeonggi-do (KR); Won Joo Yun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 17/449,861

(22) Filed: Oct. 4, 2021

(65) Prior Publication Data
US 2023/0110208 A1    Apr. 13, 2023

(51) Int. Cl.
*G11C 11/4093*    (2006.01)
*G11C 11/4076*    (2006.01)
*H01L 25/18*    (2023.01)

(52) U.S. Cl.
CPC ...... *G11C 11/4093* (2013.01); *G11C 11/4076* (2013.01); *H01L 25/18* (2013.01)

(58) Field of Classification Search
CPC ................ G11C 11/4093; G11C 11/4076
USPC .................................................... 365/189.09
See application file for complete search history.

(56) References Cited

U.S. PATENT DOCUMENTS

| | | | |
|---|---|---|---|
| 6,400,177 B1 * | 6/2002 | Yoshizaki | H03K 19/00361 327/170 |
| 10,411,703 B1 * | 9/2019 | Tripathi | H03K 19/0005 |
| 10,529,390 B1 * | 1/2020 | Satoh | G11C 29/50008 |
| 10,747,245 B1 * | 8/2020 | He | G11C 29/12005 |
| 2017/0331476 A1 * | 11/2017 | Cho | G11C 29/025 |
| 2018/0114586 A1 * | 4/2018 | Jang | G11C 29/50008 |
| 2019/0080745 A1 * | 3/2019 | Kim | G11C 7/1057 |
| 2019/0259429 A1 * | 8/2019 | Heo | G11C 7/14 |

* cited by examiner

*Primary Examiner* — Connie C Yoha
(74) *Attorney, Agent, or Firm* — Dorsey & Whitney LLP

(57) ABSTRACT

A semiconductor device may include one or more output drivers. An output driver may be adjusted for impedance matching by applying a body voltage to one or more transistors of the output driver. In some examples, the body voltage applied may be based on a comparison between a reference voltage and a voltage at an external terminal. In some examples, the semiconductor device may include a calibration circuit that includes a comparator and an up/down counter that, based on a signal from the comparator, generates a code indicating the body voltage to be applied. The body voltage may be applied by a voltage generator in some examples.

20 Claims, 11 Drawing Sheets

APPARATUSES, SYSTEMS, AND METHODS FOR ZQ CALIBRATION

BACKGROUND

Semiconductor memories are used in many electronic systems to store data that may be retrieved at a later time. The data may be stored on individual memory cells of the memory as a physical signal (e.g., a charge on a capacitive element). The memory cells may be arranged in a memory array of rows (e.g., word lines) and columns (e.g., bit lines). The memory array may be further organized into bank groups, banks, planes, etc.

A semiconductor memory is typically coupled to one or more external devices, such as a memory controller. To transfer the data between the memory and the external device, time varying signals may be used over one or more conductors often referred to as signal lines. These signal lines are often bundled together to form a communications bus, such as an address or data bus, for example.

To meet the demands for higher performance operating characteristics, designers continue to strive for increasing operating speeds to transfer data across these communications buses. However, one issue with increased data transfer rates is maintaining signal integrity during these bursts of data on the various bus signal lines. As these transfer rates increase, the impedance characteristics of a data bus become more pronounced. Capacitive and inductive characteristics of the signal lines may begin to distort the signal waveforms on the data bus at these higher data rates. Waveforms may begin to spread out and/or reflections may occur at locations of unmatched impedance on the data bus signal lines, for example. Signal integrity (e.g., data integrity) can be affected when an impedance (e.g., output impedance) of one or more external terminals (e.g., data (DQ) terminals) of a memory device is not properly matched to the impedance of the communications bus. Impedance mismatch might result from process variations, temperature variations and voltage (e.g., power supply potential) variations in a memory device, for example. Thus, it is typically desirable to reduce these effects in order to reduce the likelihood of data corruption as data is transmitted on a data bus, for example.

In some memories, DQ terminals may be coupled to corresponding output drivers that drive data onto the data bus. An external device, such as a memory controller, coupled to the data bus may perform a training sequence to match the impedance of the DQ terminals, the data bus, and the external device in order to improve signal integrity. However, the training may be based on an assumption that the DQ terminals have a specified impedance (e.g., 240 ohms). The impedance of the DQ terminal may be set by tuning the impedance of the output drivers to the specified value.

In some memories, an output driver includes a pull-up driver and a pull-down driver. Each pull-up driver and each pull-down driver includes a set of resistances positioned in parallel between the DQ terminal and a voltage source. The impedance of the DQ terminal may be adjusted by selectively coupling or decoupling one or more of the resistances between the DQ terminal and the voltage source. In some memories, this is achieved by selectively activating or deactivating transistors associated with corresponding ones of the resistances. The activation and deactivation of the transistors may be based on a calibration code provided to the output driver. The calibration code may include a same number of bits as the number of transistors, and individual bits may be provided to gates of corresponding transistors via control lines. For example, a transistor receiving a '1' may be activated, coupling a resistance between the DQ terminal and the voltage source and a transistor receiving a '0' may be inactivated, decoupling a resistance from the DQ terminal and/or voltage source.

This technique of impedance matching for the data bus requires sets of resistances for each DQ pin as well as individual control lines to provide the bits of the calibration code to the transistors. However, as the density of memory devices continue to increase, the size of DQ terminals and the spacing between DQ terminals continues to decrease. This decreases the space available for placing sets of resistances and control lines. Accordingly, more compact techniques for impedance matching of DQ terminals, and other external terminals of memory devices, may be desired.

DETAILED DESCRIPTION

Apparatuses and methods for setting the impedance of external terminals of a semiconductor device to a specified value, such as data (DQ) terminals of a memory device are disclosed. In some examples, a body voltage may be applied to one or more transistors of an output driver coupled to a DQ terminal to adjust the impedance. In some examples, applying a body (e.g., back) voltage to a transistor of the output driver may reduce a number of transistors and/or resistances of the output driver. In some examples, applying a body voltage to a transistor of the output driver may reduce a number of control lines provided to the output driver.

Figure 1:
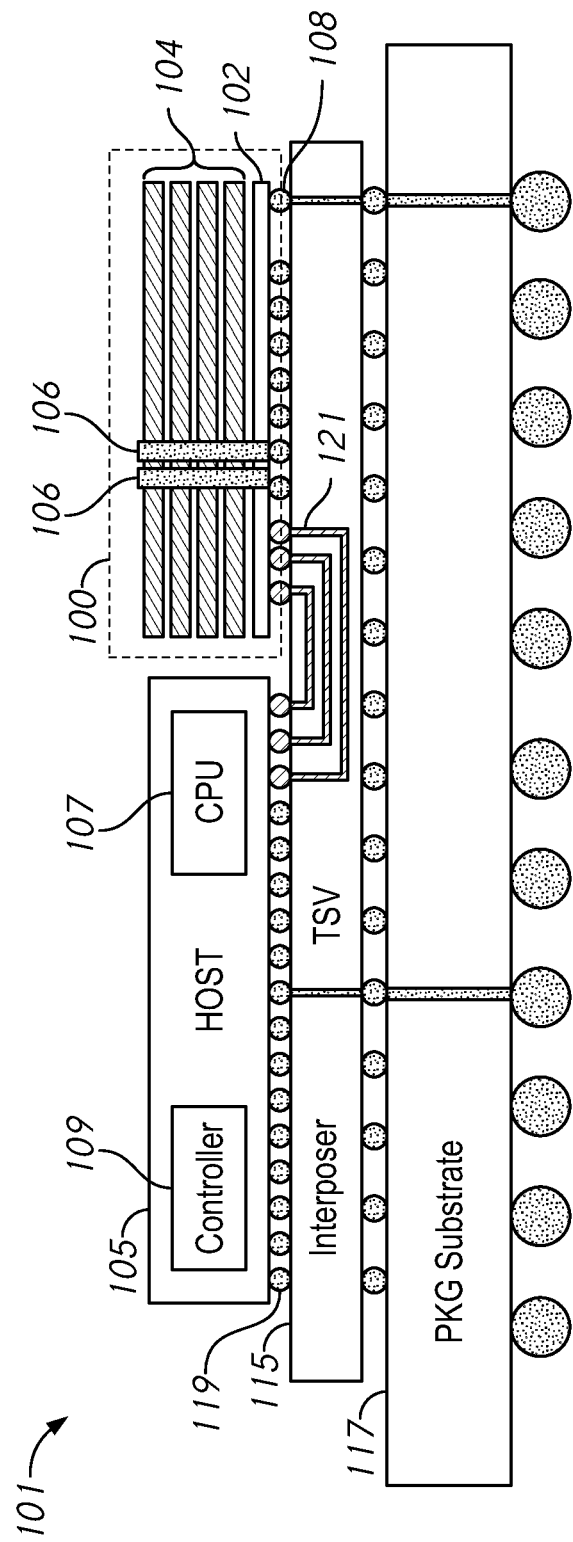
FIG. 1 is a block diagram of an example semiconductor system according to at least one embodiment of the disclosure.

FIG. 1 is a block diagram of an example semiconductor system according to at least one embodiment of the disclosure. The semiconductor system 101 may include a semiconductor device 100, which may be a three-dimensional (3D) memory device in some examples, and a host 105. In some examples, the host 105 may include a central processing unit (CPU) 107 and/or a memory controller 109. The semiconductor device 100 and host 105 may be disposed on an interposer 115 on a package substrate 117.

The semiconductor device 100 may be a high bandwidth memory (HBM) in some embodiments. The semiconductor device 100 may include multiple die including a logic die 102 and core die 104 stacked with each other. In this example, each core die 104 may be a memory die. Each of the core die 104 may include memory cells, which may be arranged in a memory array. The core die 104 may further include circuitry for accessing the memory cells. In some examples, the memory cells may be DRAM memory cells. The logic die 102 may include circuitry for accessing the memory cells on the core die 104 for memory operations. For example, the logic die 102 may include a command/address input circuit for receiving commands and addresses from the memory controller 109. In some examples, the logic die 102 may include an internal clock generator for providing clock signals to the core die 104 and/or other components of the logic die 102. In some examples, the logic die 102 may include an internal voltage generator for receiving external voltages (e.g., VSS, VDD) and providing various internal voltages to the core die 104 and/or other components of the logic die 102.

The semiconductor device 100 may include conductive through silicon vias (TSVs) 106 (e.g., through substrate electrodes) which couple the logic die 102 and core die 104 by penetrating the logic die 102 and core die 104. The logic die 102 may be coupled to the interposer 115 via interconnects, such as bumps 108 exposed on an outside of the logic die 102. In some embodiments, one or more of the bumps 108 may be data (DQ) terminals. The bumps 108 may be coupled to bumps 119 of the host 105 via conductive lines 121. The conductive lines 121 and bumps 119 may allow signals, such as data signals, to be provided to the controller 109 and/or CPU 107 of the host 105. The impedance of the bumps 108 may be matched to the conductive lines 121 and/or bumps 119 to improve signal integrity between the semiconductor device 100 and host 105. For example, matching the impedance may reduce ringing as discussed in the background.

In some embodiments, the microbumps 108 may be approximately 25 microns in diameter and have a center-to-center spacing between of approximately 100 microns. Accordingly, when the bumps 108 are DQ terminals, the available spacing to provide output drivers for each terminal is limited. In some applications, there may not be sufficient room for sets of resistances (e.g., resistors, transistors, etc.) in the output drivers. Accordingly, alternative techniques for setting an impedance of the external terminals (e.g., the bumps 108) would be desirable.

Figure 2:
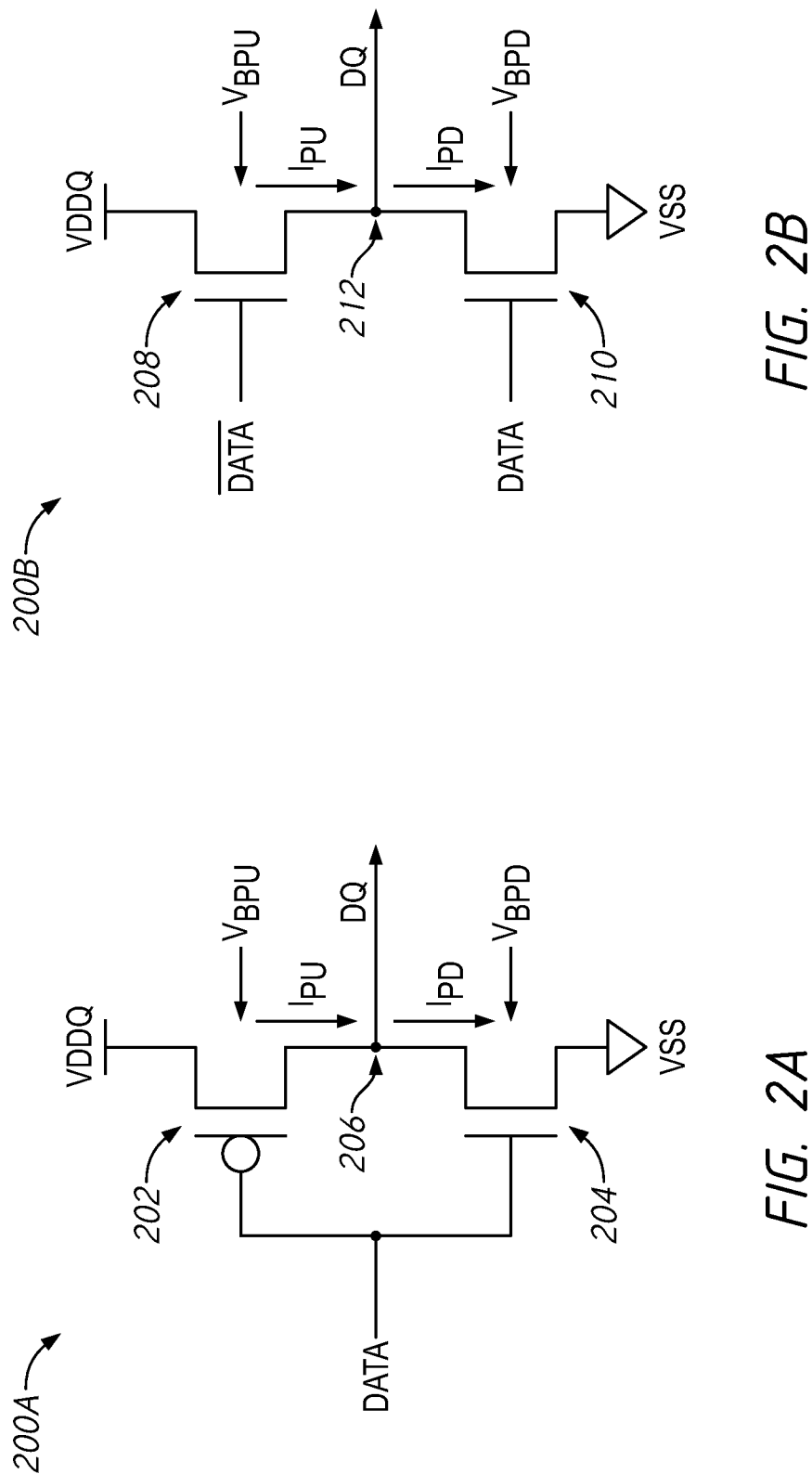
FIGS. 2A and 2B are circuit diagrams of output drivers according to embodiments of the disclosure.

FIGS. 2A and 2B are circuit diagrams of output drivers according to embodiments of the disclosure.

FIG. 2A is a circuit diagram for a "P over N" output driver 200A. Output driver 200A includes a pull-up driver including a P-type transistor 202 and a pull-down driver including an N-type transistor 204. The P-type transistor 202 and the N-type transistor 204 are coupled in series between two voltage sources (VDDQ and VSS in the example shown in FIG. 2A). The P-type transistor 202 and N-type transistor 204 are activated or deactivated responsive to a data signal received at the gates of the transistors. A signal is provided to a DQ terminal at a node 206 between the P-type transistor 202 and the N-type transistor 204. If the data signal is high, the P-type transistor 202 will be deactivated, decoupling the VDDQ from the node 206. The N-type transistor 204 will be activated, coupling the node 206 to VSS. Thus, a voltage of the DQ terminal will be driven toward VSS. In contrast, if the data signal is low, the N-type transistor 204 will be deactivated, decoupling the VSS from the node 206. The P-type transistor 202 will be activated, coupling the node 206 to VDDQ. Thus, a voltage of the DQ terminal will be driven toward VDDQ.

FIG. 2B is a circuit diagram for an "N over N" output driver 200B. Output driver 200B includes a pull-up driver including an N-type transistor 208 and a pull-down driver including an N-type transistor 210. The N-type transistor 208 and the N-type transistor 210 are coupled in series between two voltage sources (VDDQ and VSS in the example shown in FIG. 2B). The N-type transistor 208 is selectively activated or deactivated responsive to an inverse data signal received at the gate, and N-type transistor 210 is activated or deactivated responsive to a data signal received at the gate. A signal is provided to a DQ terminal at a node 212 between the N-type transistors 208 and 210. If the data signal is high, the inverse data signal will be low, and the N-type transistor 208 will be deactivated, decoupling the VDDQ from the node 212. The N-type transistor 210 will be activated by the high data signal, coupling the node 212 to VSS. Thus, a voltage of the DQ terminal will be driven toward VSS. In contrast, if the data signal is low, the N-type transistor 210 will be deactivated, decoupling the VSS from the node 212. The inverse data signal will be high, and the N-type transistor 208 will be activated, coupling the node 212 to VDDQ. Thus, a voltage of the DQ terminal will be driven toward VDDQ.

Typically, output driver 200A uses a supply voltage of approximately 1.2V whereas the output driver 200B uses a supply voltage of approximately 0.4V. Thus, output driver 200B may be preferable in some low-power systems.

For some devices, such as HBM, the specification for tuning output drivers to a specified impedance may be defined by a current through the pull-up driver ($I_{PU}$) and/or a current through the pull-down driver ($I_{PD}$). When the current through the output driver meets the specification, the output driver may provide a desired impedance (e.g., an impedance specified by a specification and/or standard) at the DQ terminal. As is known, current is inversely related to impedance. Thus, as current through the drivers increases, the impedance decreases and vice versa. When designing a memory device, the transistors of an output driver, such as output drivers 200A and 200B, are designed to provide the specified current to provide the desired impedance. However, various factors such as process variations, temperature, and voltage changes may cause the current to stray from the specified value. Thus, the output drivers may need to be adjusted to bring the current back to the specification in order to provide the desired impedance.

As described in the background, the output drivers may be adjusted by selectively coupling and decoupling resistances in the pull-up and pull-down drivers. The change in resistance of the drivers adjusts the current and thus the impedance. However, this technique may require significant layout area, particularly if resistors are used for the resistances.

According to embodiments of the present disclosure, in order to adjust the impedance, the current of an output driver may be adjusted by applying a body voltage to one or more transistors of the output driver. In the examples shown in FIGS. 2A and 2B, body voltage $V_{BPU}$ are provided to pull-up driver transistors 202 and 208 and body voltage $V_{BPD}$ are provided to pull-down driver transistors 204 and 210.

According to the Shichman-Hodges model of a transistor, the drain current ($I_D$) of a transistor is given by:

$$I_D = \frac{\mu_n c_{ox}}{2} \frac{W}{L} [V_{GS} - V_T]^2 \quad \text{Equation (1)}$$

Where $\mu_n$ is the electron mobility, cox is the capacitance of the oxide, W is the channel width, L is the channel length, $V_{GS}$ is the gate-to-source voltage, and $V_T$ is the threshold voltage. As shown in Equation 1, the drain current $I_D$ relies on a variety of factors. Typically, the electron mobility, oxide, width, and length are difficult or impossible to adjust after silicon fabrication. As shown in FIGS. 2A and 2B, the gate-to-source voltage $V_{GS}$ is based, at least in part, on the data signal. Thus, the $V_{GS}$ may also be difficult to adjust to obtain a desired current, particularly in a digital system. However, it may be possible to adjust the threshold voltage $V_T$ to cause changes to the drain current. The threshold voltage is provided by:

$$V_T = V_{T0} + \gamma(\sqrt{V_{SB} + 2\varphi_B} - \sqrt{2\varphi_B}) \quad \text{Equation (2)}$$

Where $V_{T0}$ is the threshold voltage when there is no voltage bias between the source and the body of the transistor, $\gamma$ is the bulk threshold potential, $V_{SB}$ is the bias voltage between the source and the body of the transistor, and $\varphi_B$ is the surface potential. Based on Equation 2, by applying a voltage to the body of the transistor, the bias voltage $V_{SB}$ may be altered to change the threshold voltage $V_T$. For a given gate voltage, a change in the threshold voltage $V_T$ will cause a change in the drain current $I_D$, which in turn causes a change in impedance.

Figure 3:
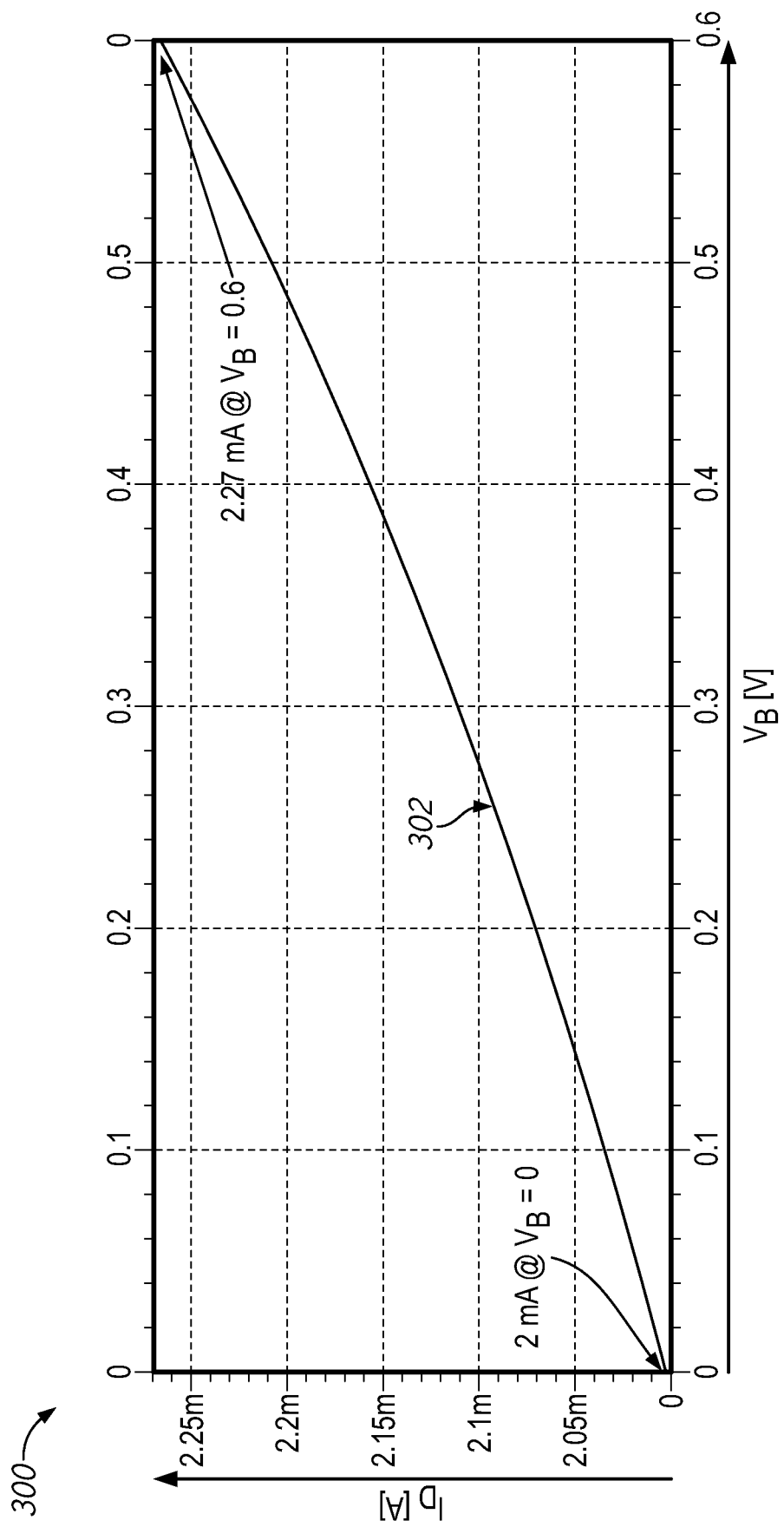
FIG. 3 is a plot of transistor drain current with respect to body voltage of an example transistor according to at least one embodiment of the present disclosure.

FIG. 3 is a plot of transistor drain current with respect to body voltage of an example transistor according to at least one embodiment of the present disclosure. In the example shown in FIG. 3, the transistor is an N-type transistor of a pull-down driver of an output driver, such as transistor 210 of FIG. 2B. In plot 300, the horizontal axis corresponds to the body voltage $V_B$ applied to the transistor in volts (V) and the vertical axis corresponds to the drain current In of the transistor in milliamps (mA). As indicated by curve 302, when a zero voltage is applied to the body of the transistor ($V_B$=0 V), the drain current $I_D$ is 2 mA, and the drain current increases to 2.27 mA when $V_B$=0.6V. As explained with reference to Equations 1 and 2, the change in drain current $I_D$ is due to the body voltage $V_B$ changing the bias voltage between the body and the source of the transistor ($V_{SB}$). In this example, over a 13% variation in current through the transistor is achieved with a body voltage range of 0-0.6V. Thus, applying a body voltage to one or more transistors of an output driver may allow the impedance to be adjusted to compensate for process variations, temperature, voltage changes, and other factors that may cause the output driver's impedance to vary from a desired value (e.g., a value indicated by a specification and/or standard).

Although plot 300 illustrates the application of a positive body voltage to a transistor to adjust the current through the transistor, a negative voltage may also be applied to the body of the transistor. Whether a positive voltage or a negative voltage is applied to the body of the transistor may be based, at least in part, on a source voltage of the transistor. The source voltage of the transistor may be based, at least in part, on whether the transistor is included in a pull-up driver or a pull-down driver and/or a type of the transistor (e.g., N-type, P-type).

Figure 4:
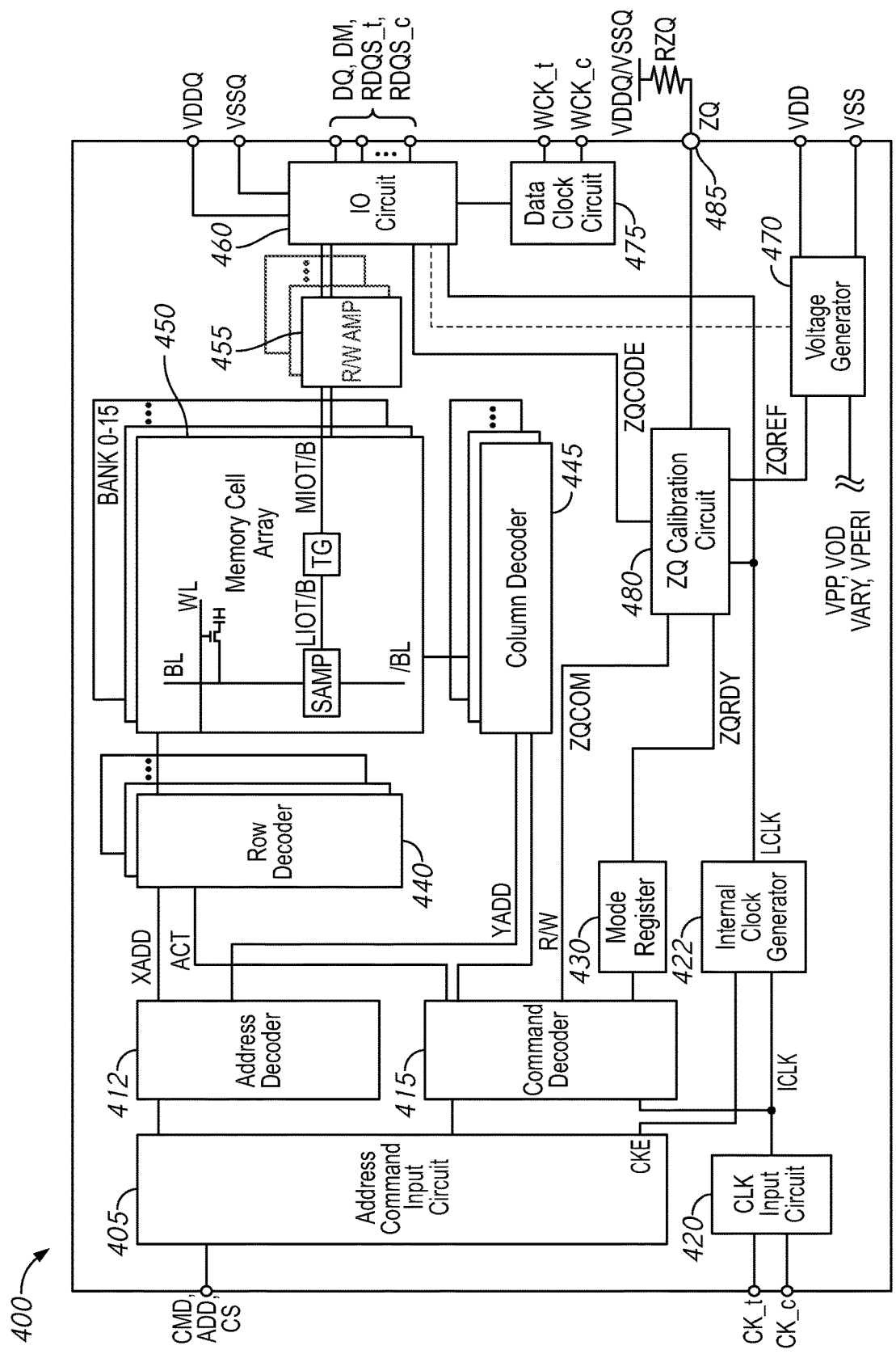
FIG. 4 is a block diagram of an apparatus according to at least one embodiment of the disclosure.

FIG. 4 is a block diagram of an apparatus according to at least one embodiment of the disclosure. The apparatus may be a semiconductor device 400, and will be referred to as such. The semiconductor device 400 may include, without limitation, a DRAM device. In some embodiments, the semiconductor device 400 may be included in semiconductor device 100 of FIG. 1. In some embodiments, a portion of the semiconductor device 400 may be included in a logic die 102 of semiconductor device 100 and a portion of the semiconductor device 400 may be included in a core die 104 of semiconductor device 100. In some embodiments, all of semiconductor device 400 may be included in a logic die 102 or a core die 104 of semiconductor device 100.

The semiconductor device 400 includes a memory array 450. The memory array 450 is shown as including a plurality of memory banks. In the embodiment of FIG. 4, the memory array 450 is shown as including sixteen memory banks BANK0-BANK15, however memory array 450 may have more or fewer memory banks in other examples (e.g., 4, 8, 32). Each memory bank includes a plurality of word lines WL, a plurality of bit lines BL and /BL, and a plurality of memory cells MC arranged at intersections of the plurality of word lines WL and the plurality of bit lines BL and /BL. Selection of the word line WL is performed by a row decoder 440 and selection of the bit lines BL and /BL is performed by a column decoder 445. In the embodiment of FIG. 4, the row decoder 440 includes a respective row decoder for each memory bank and the column decoder 445 includes a respective column decoder for each memory bank. The bit lines BL and /BL are coupled to a respective sense amplifier (SAMP). Read data from the bit line BL or /BL is amplified by the sense amplifier SAMP, and transferred to an IO circuit 460 via read/write amplifiers 455 over complementary local data lines (LIOT/B), transfer gate (TG), and complementary main data lines (MIOT/B). Conversely, write data received at the IO circuit 460 may be provided to the read/write amplifiers 455 and transferred to the sense amplifier SAMP over the complementary main data lines MIOT/B, the transfer gate TG, and the complementary local data lines LIOT/B, and written in the memory cell MC coupled to the bit line BL or /BL. Data may be provided to and received from an external device (e.g., host 105 in FIG. 1) by I/O circuit 460 via one or more of the DQ terminals. The I/O circuit 460 may include one or more output drivers (e.g., output drivers 200A and/or 200B) to drive the data on the DQ terminals.

The semiconductor device 400 may employ a plurality of external terminals that include command and address and chip select (CA/CS) terminals coupled to a command and address bus to receive commands and addresses, and a CS signal. The external terminals may further include clock terminals to receive clocks CK_t and CK_c, and data clocks WCK_t and WCK_c, and to provide access data clocks RDQS_t and RDQS_c, data terminals DQ, data mask terminal DM and data bus inversion terminal(s) DBI, and power supply terminals to receive power supply potentials VDD, VSS, VDDQ, and VSSQ.

The clock terminals are supplied with external clocks CK_t and CK_c that are provided to an input buffer 420. The external clocks may be complementary. The input buffer 420 generates an internal clock ICLK based on the CK_t and CK_c clocks. The ICLK clock is provided to the command decoder 415 and to an internal clock generator 422. The internal clock generator 422 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 475, which generates internal data clocks based on the WCK_t and WCK_c clocks. The internal data clocks are provided to the input/output circuit 460 to time operation of circuits included in the input/output circuit 460 to time the receipt of write data.

The CA/CS terminals may be supplied with memory addresses. The memory addresses supplied to the CA/CS terminals are transferred, via a command/address input circuit 405, to an address decoder 412. The address decoder 412 receives the address and supplies a decoded row address XADD to the row decoder 440 and supplies a decoded column address YADD to the column decoder 445. The CA/CS terminals may be supplied with commands. Examples of commands include access commands for accessing the memory, such as read commands for performing read operations and write commands for performing write operations, mode register write and read commands for performing mode register write and read operations on mode register 430, a calibration signal ZQCOM to initiate a ZQ calibration operation to calibration circuit 480, as well as other commands and operations.

The commands may be provided as internal command signals to a command decoder 415 via the command/address input circuit 405. The command decoder 415 includes circuits to decode the internal command signals to generate various internal signals and commands for performing operations. For example, the command decoder 415 may provide a row command signal ACT to select a word line and a column command signal R/W to select a bit line.

When an activate command and a row address are received, followed by a read command and a column address, read data is read from memory cells in the memory array 450 corresponding to the row address and column address. The read command is received by the command decoder 415, which provides internal commands so that read data and from the memory array 450 is provided to the output receives in the input/output circuit 460.

When an activate command and a row address are received, followed by a write command and a column address, write data is written to a memory cells in the memory array 450 corresponding to the row address and column address. A data mask may be provided to the data mask terminals DM to mask portions of the data when written to memory. The write command is received by the command decoder 415, which provides internal commands so that the write data is received by input receivers in the input/output circuit 460.

The power supply terminals are supplied with power supply potentials VDD and VSS. The power supply potentials VDD and VSS are supplied to an internal voltage generator circuit 470. The internal voltage generator circuit 470 generates various internal potentials VPP, VOD, VARY, VPERI, ZQREF, and the like based on the power supply potentials VDD and VSS supplied to the power supply terminals. The internal potential VPP is mainly used in the row decoder 440, the internal potentials VOD and VARY are mainly used in the sense amplifiers SAMP included in the memory array 450, and the internal potential VPERI is used in many peripheral circuit blocks.

The power supply terminals are also supplied with power supply potentials VDDQ and VSSQ. The power supply potentials VDDQ and VSSQ are supplied to the input/output circuit 460. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 460 so that power supply noise generated by the input/output circuit 460 does not propagate to the other circuit blocks.

According to embodiments of the present disclosure, semiconductor device 400 may include a calibration terminal ZQ 485 coupled to an external resistance RZQ. The external resistance RZQ may be coupled to a power supply voltage, such as VDDQ or VSSQ in the example shown in FIG. 4. In some embodiments, the external resistance RZQ may be a resistor. In some embodiments, the external resistance RZQ may have a resistance of 240 ohms. However, other resistance values may be used in other embodiments. The calibration terminal ZQ 485 may allow a ZQ calibration circuit 480 to access the external resistance RZQ in order to perform impedance calibration operations (e.g., setting an impedance of external terminals such as the DQ terminals).

The calibration circuit 480 may include circuits to perform calibration operations, for example, when activated by the calibration signal ZQCOM. The calibration operations may be performed with reference to an impedance of the external resistance RZQ and the reference voltage ZQREF. During a calibration operation, the ZQ calibration circuit 480 may calibrate impedances of external terminals, such as the DQ terminals, to the external resistance RZQ, by determining one or more calibration parameters. In some embodiments, the calibration parameters may include a body bias voltage to apply to one or more transistors of an output driver of the IO circuit 460 associated with the external terminals. The calibration parameters determined by the calibration circuit 480 during the calibration operation may be stored by the ZQ calibration circuit 480. The stored calibration parameters may be retrieved and applied to the transistors of the output drivers. An impedance code ZQCODE representing calibration parameters is supplied to the 10 circuit 460 to set the body bias voltages, which may provide a desired impedance at the external terminals. In some embodiments, the IO circuit 460 may include one or more voltage generators that generate the body bias voltages based, at least in part, on the ZQCODE received from the calibration circuit 480. In some embodiments, the voltages may be generated based on VDDQ and VSSQ received by the 10 circuit 460. In some embodiments, the voltages may be generated based on internal voltages received from the voltage generator 470.

In some embodiments, the ZQ calibration circuit 480 may program calibration information ZQRDY into the mode register 430. The calibration information ZQRDY may indicate an aspect of the calibration operation. For example, in some embodiments the value of the calibration information ZQRDY programmed in the mode register 430 represents whether the calibration operation is completed. In some embodiments the value of the calibration information ZQRDY represents whether any new calibration parameters have been determined by the ZQ calibration circuit 480. The mode register 430 may be queried, for example, by memory controller 109, to retrieve the calibration information reflecting an aspect of the calibration operation, for example, completion of the calibration operations and/or new calibration parameters have been determined.

Providing the calibration information to be queried allows for a memory controller to be informed as to an aspect of the calibration operation. In some embodiments, the calibration information may be used by the memory controller to determine when to issue a command to apply the calibration parameters, rather than issuing the command at the end of a time period under the assumption that all devices have completed calibration operations. As previously described, as systems include more and more devices, completing calibration operations for the multiple device system within the time period becomes very challenging. By programming calibration information into the mode registers, a memory controller can determine when to issue the command to apply the calibration parameters by periodically reading the mode register rather than idling until the calibration operations are completed.

In some embodiments, following completion of the calibration operation for a power up sequence, the calibration parameters may be applied by the semiconductor device 400 without relying on any commands from a memory controller or other external device. For example, the semiconductor device 400 may apply the calibration parameters automatically after determining the calibration operation is completed without waiting for a command from the memory controller. In this manner, the memory controller does not need to be involved with the calibration of impedances during a power up sequence. The memory controller, however, may check the status of the calibration operation by checking the calibration information in the mode register 430.

As will be described in more detail below, the ZQ calibration circuit 480 may perform calibration operations and maintain calibration parameters responsive to commands (e.g., activation of the ZQCOM signal) or in the background. That is, the calibration circuit 480 may perform calibration operations and maintain calibration parameters without receiving an external calibration command, for example, from a memory controller. In this manner, calibration operations can be performed and the calibration parameters maintained by the semiconductor device 400 without waiting for a calibration command.

Calibration operations may be performed as part of a power-on sequence that occurs when power is first provided to the semiconductor device 400. Calibration operations may also be performed by the calibration circuit 480 when there is a change in operating condition for the semiconductor device 400. For example, calibration operations may be performed by the ZQ calibration circuit 480 based on the operating temperature of the semiconductor device 400, such as a change in the operating temperature may cause calibration operations to be performed, or the operating temperature exceeds or falls below a temperature limit. Calibration operations may also be performed based on time. For example, the ZQ calibration circuit 480 may perform calibration operations after a time period has elapsed. The ZQ calibration circuit 480 may perform calibration operations periodically as another example.

The calibration circuit 480 may provide an indication of completing calibration operations or determining new calibration parameters by updating information in the mode register 430. For example, in some embodiments, the ZQ calibration circuit 480 updates a bit stored in the mode register 430. The mode register 430 may be queried, for example, by a memory controller, to retrieve the updated bit reflecting the completion of the calibration operations. The calibration circuit 480 may additionally or alternatively update information in the mode register 430 to provide indication of updated calibration parameters. The calibration parameters may be changed (e.g., updated) following a calibration operation triggered by the ZQ calibration circuit 480, such as previously discussed. While calibration codes may be stored in a separate code storage circuit, in some embodiments, the calibration codes may be stored in the mode register 430 in addition to or instead of data relating to whether the calibration is completed and whether or not the codes were updated.

Figure 5:
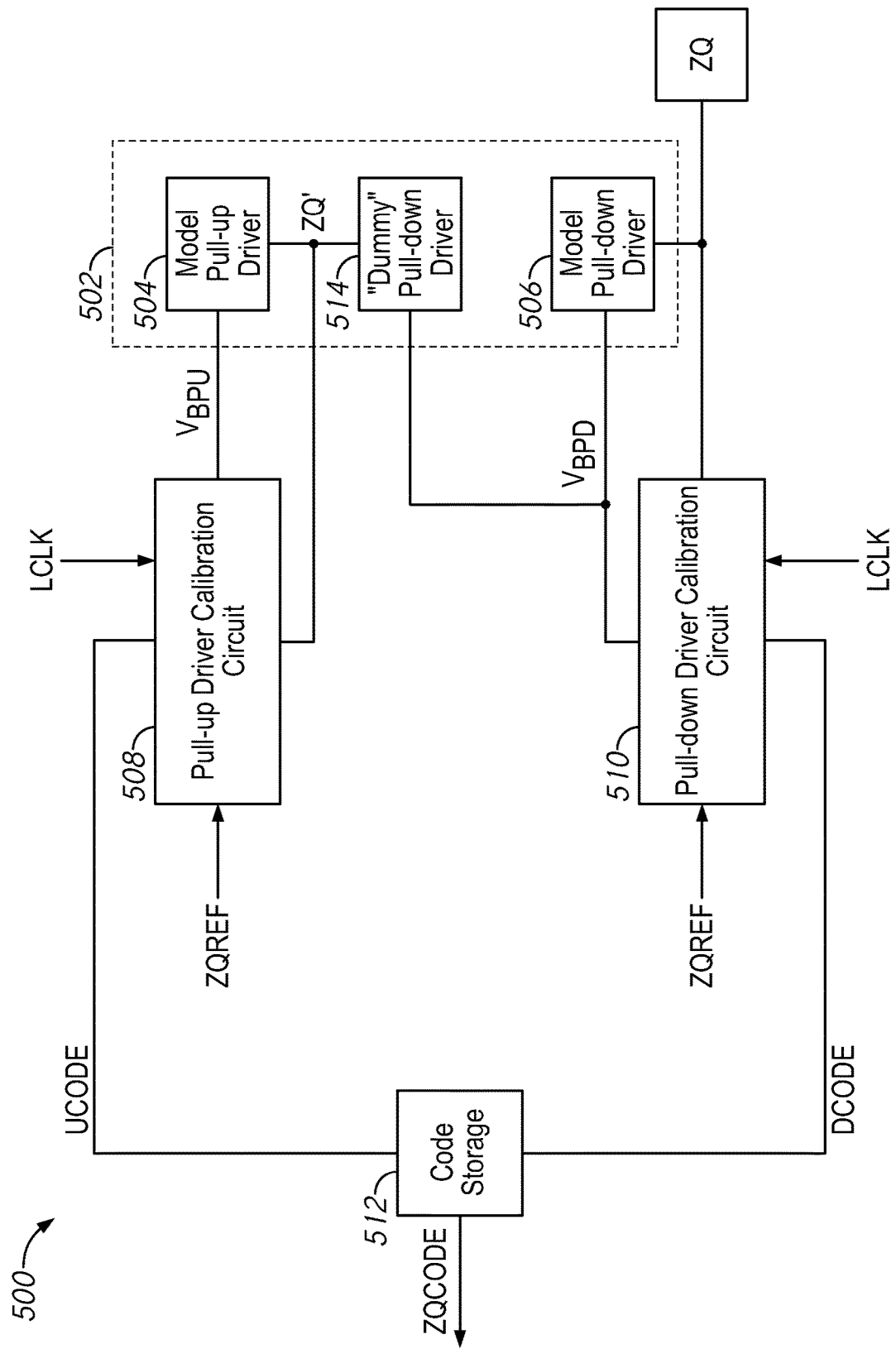
FIG. 5 is a block diagram of at least a portion of a ZQ calibration circuit according to at least one embodiment of the present disclosure.

FIG. 5 is a block diagram of at least a portion of a ZQ calibration circuit according to at least one embodiment of the present disclosure. In some embodiments, ZQ calibration circuit 500 may be included in ZQ calibration circuit 480. For context, an external ZQ terminal is also shown. In some embodiments, ZQ terminal may be ZQ terminal 485.

In most applications, individually calibrating the impedance for each external terminal of a semiconductor device, such as semiconductor devices 100 and 400, is impractical. Accordingly, ZQ calibration circuits, such as ZQ calibration circuit 500, may employ a model output driver that includes transistors that have the same properties (e.g., material, dimensions, etc.) as the transistors of the output drivers coupled to the external terminals. The calibration operation is performed on the model output driver to determine one or more calibration parameters, and the determined calibration parameters are applied to the output drivers of the device. If the model output driver is sufficiently similar to the output drivers (and the output drivers are sufficiently similar to one another), the calibration parameters will provide a desired impedance at the external terminals.

ZQ calibration circuit 500 includes a model output driver 502 that includes a model pull-up driver 504 and a model pull-down driver 506. In some embodiments, the pull-up driver 504 may include a P-type transistor, such as transistor 202, or an N-type transistor, such as transistor 208. In some embodiments, pull-down driver 506 may include an N-type transistor, such as transistor 210. The model output driver 502 may be designed to have substantially the same characteristics as output drivers coupled to other external terminals, such as DQ terminals.

The ZQ calibration circuit 500 may include a pull-up driver calibration circuit 508 for calibrating the model pull-up driver 504 and a pull-down driver calibration circuit 510 for calibrating the model pull-down driver 506. While shown as two separate components in FIG. 5, in some embodiments, the pull-up driver calibration circuit 508 and pull-down driver calibration circuit 510 may be a single circuit and/or one or more circuit components (e.g., logic gates, counters, comparators) may be shared between the two circuits.

In some embodiments, one of the model drivers of the model output driver may be coupled to the ZQ terminal. An additional "dummy" driver may be used to calibrate the other driver. In the example shown in FIG. 5, the model pull-down driver 506 of output driver 502 is coupled to the ZQ terminal and a dummy pull-down driver 514 is used to calibrate the model pull-up driver 504. However, one having skill in the art would understand that alternatively, model pull-up driver 504 may be coupled to the ZQ terminal and a dummy pull-up driver may be used to calibrate the pull-down driver 506.

The pull-down driver calibration circuit 510 may calibrate the model pull-down driver 506 by measuring a voltage at a node coupled to the ZQ terminal, which may represent a voltage at the ZQ terminal, and comparing the voltage to a reference voltage ZQREF. In some embodiments, ZQREF may be provided by a voltage generator, such as voltage generator 470. In some embodiments, ZQREF may be equal to VDDQ/2. However, other voltages may be used as ZQREF in other embodiments. Based on a comparison between the voltage at the ZQ terminal and ZQREF, the pull-down driver calibration circuit 510 adjusts a body voltage $V_{BPD}$ applied to a body of a transistor of the model pull-down driver 506. Adjusting the $V_{BPD}$ adjusts a current across the transistor, and thus the impedance and the voltage at the ZQ terminal. As will be described in more detail herein, the pull-down driver calibration circuit 510 may perform the calibration operation in conjunction with an internal clock signal LCLK. In some embodiments, the clock signal LCLK may be provided by an internal clock generator, such as internal clock generator 422.

When a value for $V_{BPD}$ is found that causes the ZQREF and the voltage at the ZQ terminal to be equal (e.g., the same), the pull-down driver calibration circuit 510 may provide a code DCODE associated with the value of $V_{BPD}$. As used herein, equal or the same also includes substantially equal or the same, such as two values within 10% of one another. In some embodiments, the code DCODE may be a multibit code. The number of bits used to encode DCODE may be based, at least in part, on a number of different values for $V_{BPD}$ that can be generated by the semiconductor device. The DCODE may be stored in a code storage circuit 512.

Once the model pull-down driver 506 is calibrated, the pull-down driver calibration circuit 510 may provide the calibrated value of $V_{BPD}$ to the dummy pull-down driver 514. The pull-up driver calibration circuit 508 may calibrate the model pull-up driver circuit 504 based on a comparison of the ZQREF and a voltage measured at a node ZQ' between the model pull-up driver 504 and the dummy pull-down driver 514 rather than at the ZQ terminal. Based on a comparison between the voltage the node ZQ' and ZQREF, the pull-up driver calibration circuit 508 adjusts a body voltage $V_{BPU}$ applied to a body of a transistor of the model pull-up driver 504. As will be described in more detail herein, the pull-up driver calibration circuit 508 may perform the calibration operation in conjunction with an internal clock signal LCLK.

When a value for $V_{BPU}$ is found that causes the ZQREF and the voltage at the node ZQ' to be equal, the pull-up driver calibration circuit 508 may provide a code UCODE associated with the value of $V_{BPU}$. In some embodiments, the code UCODE may also be a multibit code. The number of bits used to encode UCODE may be based, at least in part, on a number of different values for $V_{BPU}$ that can be generated by the semiconductor device. The UCODE may be stored in the code storage circuit 512.

In some embodiments, the code storage circuit 512 may include one or more registers for storing the UCODE and the DCODE. The codes UCODE and DCODE for the pull-up drivers and pull-down drivers of the output drivers may be provided from the code storage circuit 512 as ZQCODE. The code storage circuit 512 may provide the ZQCODE to an IO circuit (e.g., IO circuit 460) including output drivers of external terminals, such as the DQ terminals. In some embodiments, the ZQCODE may be provided by the code storage circuit 512 to a mode register, such as mode register 430 in addition to or instead of the 10 circuit. In some embodiments, the ZQCODE may be provided to the IO circuit via the mode register rather than directly from the code storage circuit 512.

In some embodiments, the model pull-down driver 506 is calibrated first and then the model pull-up driver 504 is calibrated second, but in other embodiments, the drivers 504, 506 are calibrated in the reverse order, such as when the ZQ calibration circuit 500 includes a dummy pull-up driver rather than a dummy pull-down driver.

Figure 6:
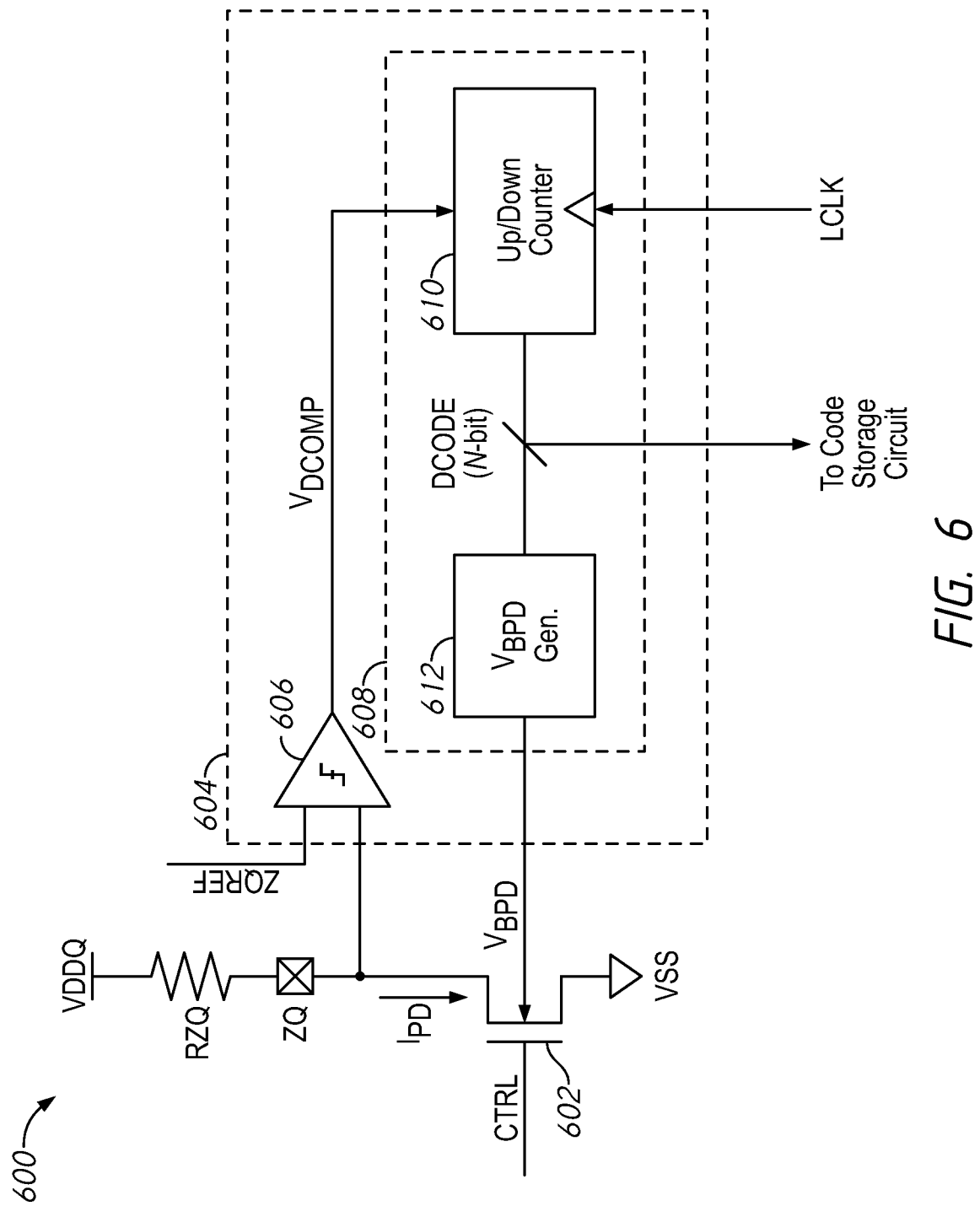
FIG. 6 is a block diagram of at least a portion of a ZQ calibration circuit according to at least one embodiment of the present disclosure.

FIG. 6 is a block diagram of at least a portion of a ZQ calibration circuit according to at least one embodiment of the present disclosure. In some embodiments, ZQ calibration circuit 600 may be included in ZQ calibration circuit 480 and/or 500. For context, an external ZQ terminal and resistance RZQ are also shown.

ZQ calibration circuit 600 includes an N-type transistor 602. N-type transistor 602 may be included in a model pull-down driver, such as model pull-down driver 506. The transistor 602 may receive a control signal CTRL at a gate. The control signal CTRL may model a signal received at a pull-down driver, such as a data signal provided to the gate of a pull-down driver of a data terminal DQ. The control signal CTRL may be controlled by the ZQ calibration circuit 600 to model a data signal provided to an output driver and/or to eliminate current flow during normal operation. In some embodiments, the control signal CTRL may be enabled by the ZQ calibration circuit 600 during calibration.

The ZQ calibration circuit 600 may include a pull-down calibration circuit 604. Pull-down calibration circuit 604 may be included in pull-down calibration circuit 510 in some embodiments. The pull-down calibration circuit 604 may include a comparator 606 and calibration logic circuit 608. The comparator 606 may receive a reference voltage ZQREF (e.g., from reference voltage generator 470) and a voltage of the ZQ terminal. Based on a comparison of the voltage at the ZQ terminal and the ZQREF, the comparator 606 may provide a comparison signal $V_{DCOMP}$. The voltage of $V_{DCOMP}$ may indicate a difference between the voltage at the ZQ terminal and ZQREF. In some embodiments, comparator 606 may be a step-wise or digital comparator. That is, $V_{DCOMP}$ may be provided at one of two levels. For example, $V_{DCOMP}$ may be provided at a voltage corresponding to a logic high (e.g., '1') when the voltage at the ZQ terminal is greater than ZQREF and provided at a voltage corresponding to a logic low (e.g., '0') when the voltage at the ZQ terminal is less than ZQREF. The calibration logic circuit 608 may provide a body voltage $V_{BPD}$ having a value based, at least in part, on $V_{DCOMP}$.

In some embodiments, such as the one shown in FIG. 6, calibration logic circuit 608 may include an up/down counter 610 and a voltage generator 612. The up/down counter 610 may increase or decrease a count based, at least in part, on $V_{DCOMP}$. The count may be an N-bit count that corresponds to a code DCODE. The code DCODE may be provided to the voltage generator 612. The voltage generator 612 provides a body voltage $V_{BPD}$ to transistor 602. The value of $V_{BPD}$ is based, at least in part, on the code DCODE. In some embodiments, each value of the code DCODE may correspond to a different value of $V_{BPD}$. In some embodiments, the number of bits in the code DCODE is based on a number of different values of $V_{BPD}$ that can be generated by the voltage generator 612. In some embodiments, for a given voltage range, more values of $V_{BPD}$ may provide greater granularity for adjusting the current of transistor 602, for example, the step-size between voltage levels is smaller. In some embodiments, the step-sizes defined by the code DCODE may be evenly spaced. However, in other embodiments, the step-sizes may not be evenly spaced. The code DCODE may also be provided from the calibration logic circuit 608 to a code storage circuit, such as code storage circuit 512.

In some embodiments, the up/down counter 610 may receive a clock signal LCLK (e.g., from internal clock generator 422). In some embodiments, the up/down counter 610 may adjust the count (and thus the code DCODE) based on the signal $V_{DCOMP}$ responsive to an edge of the clock signal LCLK (e.g., rising, falling, or both).

Figure 7:
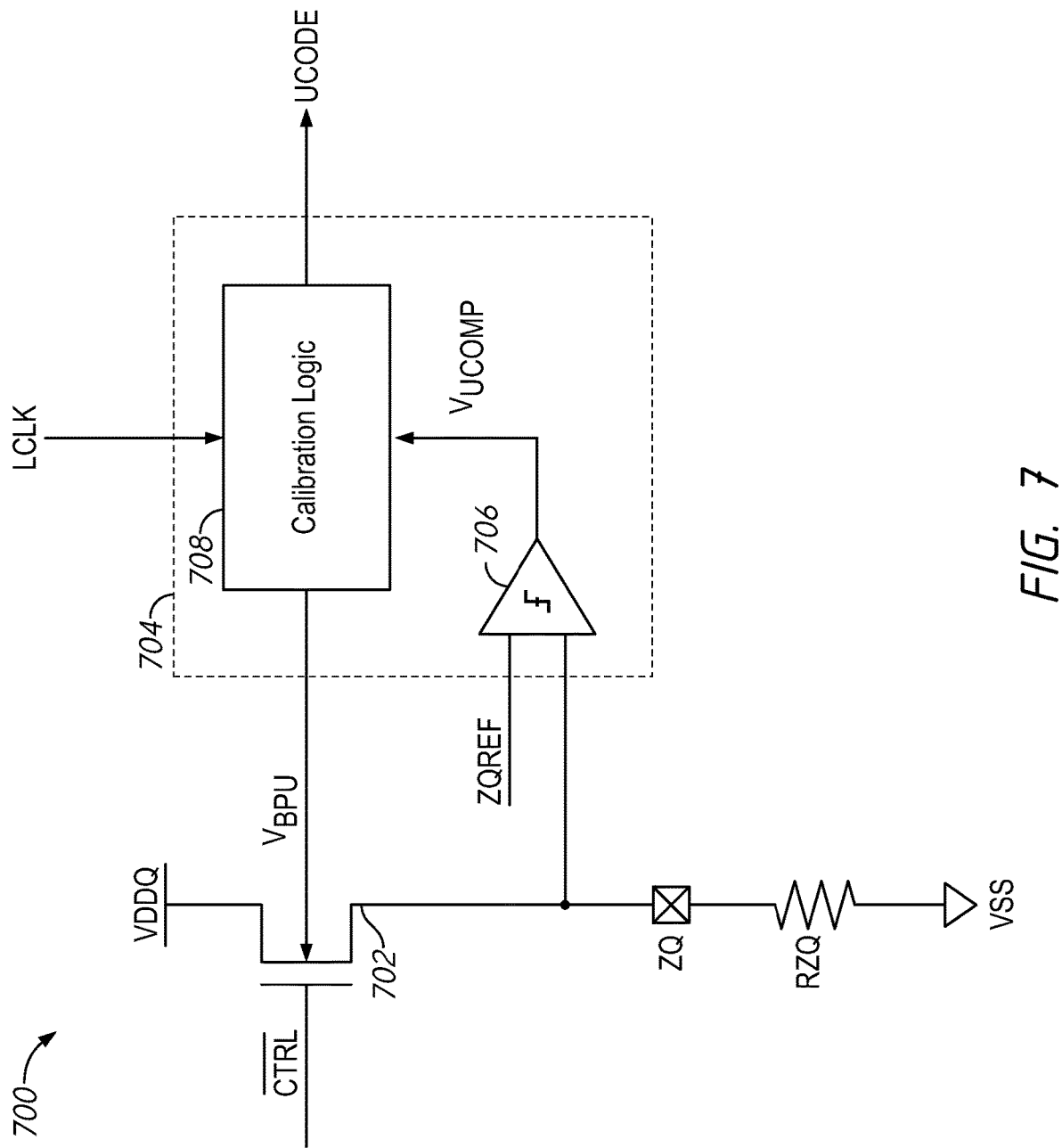
FIG. 7 is a block diagram of at least a portion of a ZQ calibration circuit according to at least one embodiment of the present disclosure.

FIG. 7 is a block diagram of at least a portion of a ZQ calibration circuit according to at least one embodiment of the present disclosure. In some embodiments, ZQ calibration circuit 700 may be included in ZQ calibration circuit 480 and/or 500. For context, an external ZQ terminal and resistance RZQ are also shown.

ZQ calibration circuit 700 includes an N-type transistor 702. N-type transistor 702 may be included in a model pull-up driver, such as model pull-up driver 504. The transistor 702 may receive another control signal CTRL bar at a gate. In some embodiments, the ZQ calibration control circuit 700 may control the control signal CTRL bar to model an inverse of a signal received at a pull-up driver, such as an inverse of a data signal provided to the gate of a pull-up driver of a data terminal DQ. However, the ZQ calibration circuit 700 may cause the control signal CTRL bar to have other values when enabled during calibration. In some embodiments, both control signals CTRL and CTRL bar may be enabled by the ZQ calibration circuit 700 during a calibration operation. In some embodiments, control signals CTRL and CTRL bar may be enabled simultaneously.

The ZQ calibration circuit 700 may include a pull-up calibration circuit 704. Pull-up calibration circuit 704 may be included in pull-up calibration circuit 508 in some embodiments. The pull-up calibration circuit 704 may include a comparator 706 and calibration logic circuit 708. The comparator 706 may receive a reference voltage ZQREF (e.g., from reference voltage generator 470) and a voltage of the ZQ terminal. Based on a comparison of the voltage at the ZQ terminal and the ZQREF, the comparator 706 may provide a comparison signal $V_{UCOMP}$. The voltage of $V_{UCOMP}$ may indicate a difference between the voltage at the ZQ terminal and ZQREF. In some embodiments, comparator 706 may be a step-wise or digital comparator, similar to comparator 606. In some embodiments, $V_{UCOMP}$ may be provided at a voltage corresponding to a logic high (e.g., '1') when the voltage at the ZQ terminal is greater than ZQREF and provided at a voltage corresponding to a logic low (e.g., '0') when the voltage at the ZQ terminal is less than ZQREF. The calibration logic circuit 708 may provide a body voltage $V_{BPU}$ having a value based, at least in part, on $V_{UCOMP}$.

In some embodiments, calibration logic circuit 708 may include an up/down counter and a voltage generator similar to calibration logic circuit 608. Similar to calibration logic circuit 608, calibration logic circuit 708 may adjust a count and a corresponding N-bit code UCODE based on the signal $V_{UCOMP}$ and the voltage generator may provide a body voltage to transistor 702 based on the code UCODE. The code UCODE may be provided from the calibration logic circuit 708 to a code storage circuit, such as code storage circuit 512.

In some embodiments, the calibration logic circuit 708 may receive a clock signal LCLK (e.g., from internal clock generator 422). In some embodiments, the up/down counter may adjust the count (and thus the code UCODE) based on the signal $V_{UCOMP}$ responsive to an edge of the clock signal LCLK (e.g., rising, falling, or both), similar to calibration logic circuit 608.

Figure 8:
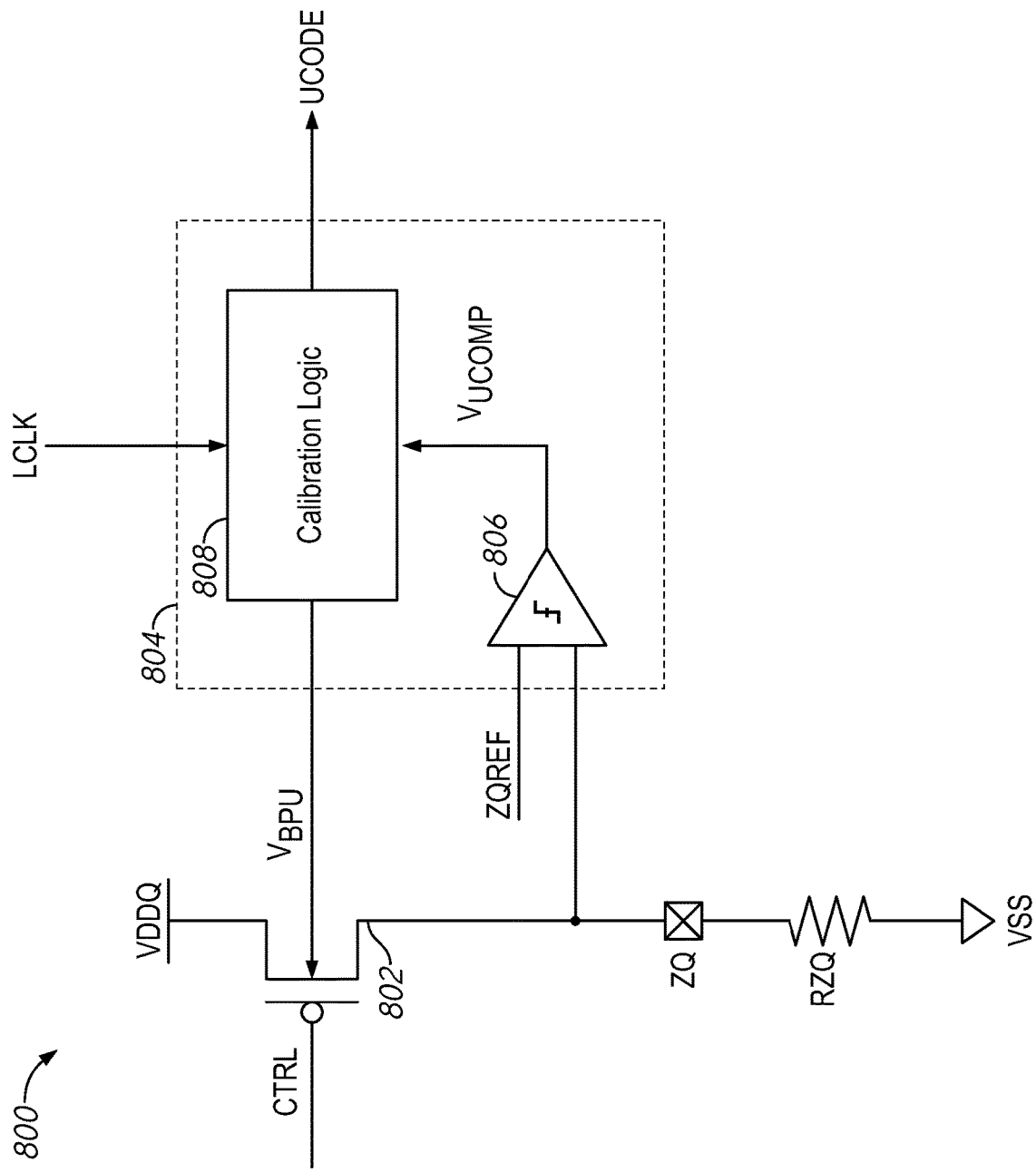
FIG. 8 is a block diagram of at least a portion of a ZQ calibration circuit according to at least one embodiment of the present disclosure.

FIG. 8 is a block diagram of at least a portion of a ZQ calibration circuit according to at least one embodiment of the present disclosure. In some embodiments, ZQ calibration circuit 800 may be included in ZQ calibration circuit 480 and/or 500. For context, an external ZQ terminal and resistance RZQ are also shown.

ZQ calibration circuit 800 includes a P-type transistor 802. P-type transistor 802 may be included in a model pull-up driver, such as model pull-up driver 504. The transistor 802 may receive a control signal CTRL at a gate. The control signal CTRL may be enabled by the ZQ calibration circuit 800 during calibration operations and in some embodiments, the control signal CTRL may model a signal received at a pull-up driver, such as a data signal provided to the gate of a pull-up driver of a data terminal DQ.

The ZQ calibration circuit 800 may be substantially the same as ZQ calibration circuit 700 except that transistor 802 is a P-type rather than an N-type and the gate of transistor 802 may receive a same control signal as a pull-down driver rather than an inverse signal. Thus, a detailed explanation of ZQ calibration circuit 800 will not be provided here. Briefly, ZQ calibration circuit may include a pull-up calibration circuit 804. Pull-up calibration circuit 804 may be included in pull-up calibration circuit 508 in some embodiments. The pull-up calibration circuit 804 may include a comparator 806 and calibration logic circuit 808. The comparator 806 may receive a reference voltage ZQREF (e.g., from reference voltage generator 470) and a voltage of the ZQ terminal. Based on a comparison of the voltage at the ZQ terminal and the ZQREF, the comparator 806 may provide a comparison signal $V_{UCOMP}$. The calibration logic circuit 808 may provide a body voltage $V_{BPU}$ having a value based, at least in part, on $V_{UCOMP}$.

Similar to calibration logic circuits 608 and 708, calibration logic circuit 808 may adjust an N-bit code UCODE based on the signal $V_{UCOMP}$ and provide a body voltage to transistor 802 based on the code UCODE. The code UCODE may be provided from the calibration logic circuit 808 to a code storage circuit, such as code storage circuit 512.

In some embodiments, the calibration logic circuit 808 may receive a clock signal LCLK (e.g., from internal clock generator 422). In some embodiments, the up/down counter may adjust the count (and thus the code UCODE) based on the signal $V_{UCOMP}$ responsive to an edge of the clock signal LCLK (e.g., rising, falling, or both).

While the calibration circuits 600-800 are shown with the pull-down or pull-up drivers coupled to the ZQ terminal, the pull-down or pull-up drivers may alternatively be coupled to a "dummy" driver as shown in FIG. 5, and the comparator may compare the reference voltage ZQREF to a voltage at a node ZQ' between the driver and the "dummy" driver.

Figure 9:
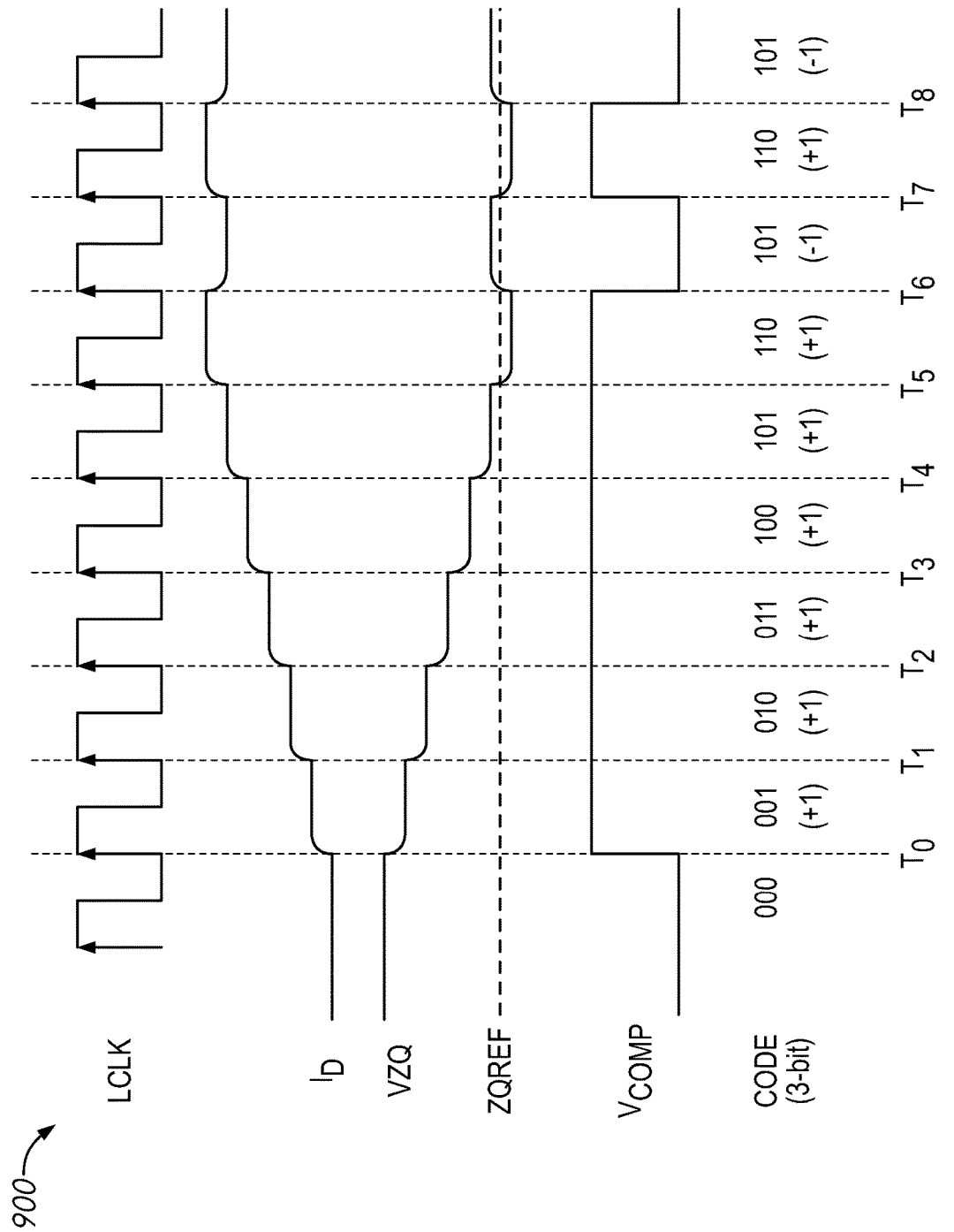
FIG. 9 is a timing diagram of a calibration operation of a ZQ calibration circuit according to at least one embodiment of the disclosure.

FIG. 9 is a timing diagram of a calibration operation of a ZQ calibration circuit according to at least one embodiment of the disclosure. Timing diagram 900 indicates the voltage and/or logic levels of a clock signal LCLK, a drain current $I_D$ of a transistor of a model output driver such as model output driver 502, a voltage of a ZQ terminal VZQ, a reference voltage ZQREF, a comparison signal $V_{COMP}$, and a code CODE, which may be signals of a ZQ calibration circuit, such as ZQ calibration circuit 480, 500, 600, 700, and/or 800. The clock signal LCLK may be provided by an internal clock generator, such as internal clock generator 422. The reference voltage ZQREF may be provided by a voltage generator, such as voltage generator 470. The comparison signal $V_{COMP}$ may be provided by a comparator circuit, such as comparator 606, 706, and/or 806. The code CODE may be a DCODE and/or a UCODE provided by a calibration logic circuit, such as calibration logic circuit 608, 708, and/or 808.

Although the calibration operation shown in timing diagram 900 may be illustrative of the operations of any of the ZQ calibration circuits 480, 500, 600, 700, and/or 800, the plots of the VZQ and drain current $I_D$ are provided for an N-type transistor of a pull-down driver, such as transistor 602, for exemplary purposes.

In the example shown in FIG. 9, the code CODE is a 3-bit code. However, in other examples, the code CODE may have more or fewer bits. Also, the CODE has an initial value of '000,' but may have a different initial value in other examples. In some embodiments, the CODE may always start with a same initial value for a calibration operation. In other embodiments, the CODE may start with an initial value that is equal to a CODE determined by a previous calibration operation.

Prior to time $T_0$, the ZQ calibration circuit may be inactive (e.g., the CODE may not be adjusted). However, responsive to an external calibration command, an internal calibration command, and/or other event (e.g., temperature change, passage of time) prior to or at $T_0$, the ZQ calibration circuit may initiate a calibration operation. In some embodiments, calibration may be performed responsive to one or more commands received during a training operation. At or around $T_0$, the voltage VZQ is greater than the reference voltage ZQREF.

Also at or around a time $T_0$, the clock signal LCLK transitions from low to high. Responsive to the rising clock edge, the calibration logic circuit may adjust the CODE based on the current state of the comparison signal $V_{COMP}$. In some embodiments, $V_{COMP}$ may be $V_{DCOMP}$. In some embodiments, such as the one shown in FIG. 6, the calibration logic circuit may include an up/down counter that increases or decreases the CODE based on the state of $V_{COMP}$. In the example shown in FIG. 9, $V_{COMP}$ is high when VZQ is greater than ZQREF and low when VZQ is less than ZQREF and CODE is increased when $V_{COMP}$ is high and decreased when $V_{COMP}$ is low. Thus, at $T_0$, since $V_{COMP}$ is high, the CODE is increased to '001.' The change in CODE may alter a body bias voltage provided to a transistor by a voltage generator, such as voltage generator 612, which in turn changes drain current $I_D$. In this example, the change in CODE causes the body bias voltage to increase, and thus increases the drain current $I_D$. The increase in drain current $I_D$ causes a decrease in VZQ.

From $T_1$-$T_5$, VZQ continues to be higher than ZQREF, accordingly, the CODE continues to be adjusted at the rising clock edges to further increase the body voltage and reduce VZQ until the CODE is set to '110.' However, at or around time $T_5$, the adjustments to the body voltage cause the VZQ to dip below ZQREF. Thus in response, at or around time $T_6$, $V_{COMP}$ transitions to low, causing the CODE to be transitioned back to '101.'

From $T_7$-$T_8$, the CODE continues to toggle between '110' and '101' as VZQ varies close to the level of ZQREF. In some embodiments, the ZQ calibration circuit may include filter logic that detects the toggling with each rising clock edge and ends the calibration operation, setting the CODE at either the higher or lower of the toggling values. By setting, it is meant the CODE is no longer changed responsive to the $V_{COMP}$ signal and may be provided to a code storage circuit, such as code storage circuit 512. In some embodiments, the ZQ calibration circuit may count a number of toggles and set the CODE to the value of the CODE when a set number of toggles (e.g., two, three) has been counted. In some embodiments, the ZQ calibration circuit may perform the calibration operation for a set number of clock cycles. For example, if the calibration operation is set to be eight clock cycles, the CODE may be set to whatever the value of the CODE was at $T_8$.

As shown in the example in FIG. 9, in some embodiments, VZQ at the final value of the CODE does not exactly equal ZQREF, but is approximately equal to ZQREF (e.g., within 10%, within 5%, within 1%). In these embodiments, even though VZQ only approximates ZQREF, VZQ may be close enough to ZQREF that the resulting impedance of the DQ terminal is sufficiently close to the specified/desired value (e.g., 240 ohms) that impedance matching may be achieved. This may be referred to as "approaching" or "approximating" the specified or desired current or impedance value.

The timing diagram 900 provides the signals for the calibration of only a portion of the model output driver (e.g., pull-down driver). The operations of timing diagram 900 may be repeated to calibrate another portion of the model output driver (e.g., pull-up driver). Once all of the portions of the model output driver have been calibrated, the calibration operation may be completed.

Once the calibration operation is completed, the CODE for each portion of the model output driver (e.g., UCODE and DCODE) may be stored in the code storage circuit and provided to an IO circuit, such as IO circuit 460.

Figure 10:
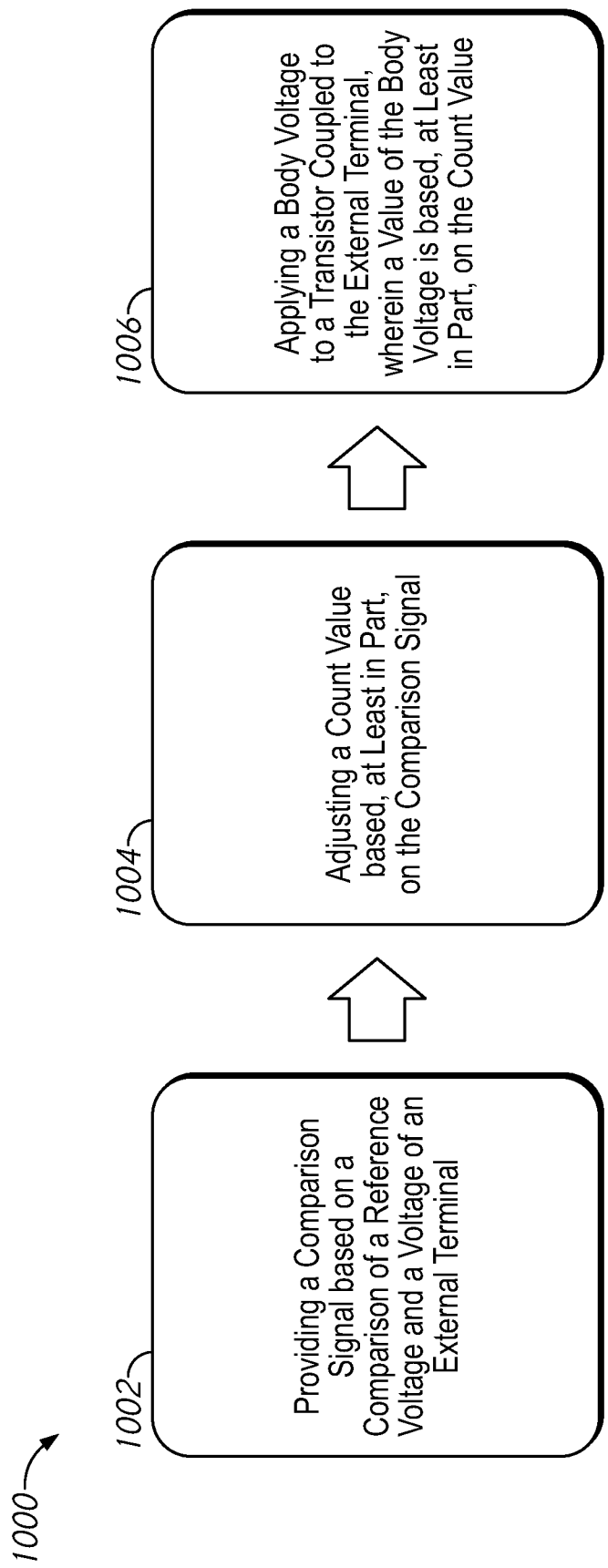
FIG. 10 a flowchart of a method according to at least one embodiment of the disclosure.

FIG. 10 is a flow chart of a method according to at least one embodiment of the disclosure. The method 1000 may be performed, at least in part, by semiconductor device 100 and/or 400, ZQ calibration circuit 500, 600, 700, and/or 800 in some embodiments.

At block 1002, "providing a comparison signal based on a comparison of a reference voltage and a voltage of an external terminal" may be performed. In some embodiments, the comparison signal may be provided by a comparator, such as comparator 606, 706, and/or 806. In some embodiments, the comparison signal may have two states: one state may indicate the reference voltage is greater than the voltage of the external terminal and another state may indicate the reference voltage is less than the voltage of the external terminal. The external terminal may be a ZQ terminal in some embodiments. In some embodiments, the reference voltage may be VDDQ/2. In some embodiments, the reference voltage may be provided by a voltage generator such as voltage generator 470.

At block 1004 "adjusting a count value based, at least in part, on the comparison signal" may be performed. In some embodiments, the count value may be adjusted by an up/down counter, such as up/down counter 610.

At block 1006, "applying a body voltage to a transistor coupled to the external terminal, wherein a value of the body voltage is based, at least in part, on the count value." In some embodiments, the body voltage may be generated by a voltage generator, such as voltage generator 612. Different values of the body voltage may be associated with different count values (e.g., codes). The count value may be adjusted by the counter such that the voltage of the external terminal approaches the reference voltage. By matching the voltage at the external terminal to the reference voltage, a current through transistor may be adjusted such that an impedance at the external terminal is set to a desired level. In some embodiments, blocks 1002-1006 may be performed responsive to a calibration command received at a semiconductor device.

Optionally, in some embodiments, the counter may receive a clock signal. The method 1000 may then further include receiving the clock signal and the adjusting the count value is responsive to an edge of the clock signal. The edge may be a rising edge or a falling edge. In some embodiments, the adjusting may be performed on both rising and falling edges of the clock signal. In some embodiments, blocks 1002-1006 may be repeated for a number of clock cycles (e.g., 8, 16). After the number of clock cycles have elapsed, the count may no longer be adjusted (e.g., "set"). The set value of the counter may be provided as a code to a code storage circuit such as code storage circuit 512.

In some embodiments, method 1000 may further include detecting a toggling of the count value between two values, setting the count value to one of the two values, and stopping the adjusting of the count value. Detecting the toggling may be based on filtering (e.g., detecting when a frequency of the VCOMP signal reaches a threshold value) or counting a number of toggles and setting the count value when a set number of toggles is reached. In some embodiments, toggling may indicate that VZQ has approached the ZQREF, and is sufficiently close to the same value to provide adequate impedance matching. After method 1000 is performed, the count value (e.g., the UCODE, DCODE, and/or ZCODE) may be provided to an IO circuit, such as IO circuit 460.

Figure 11:
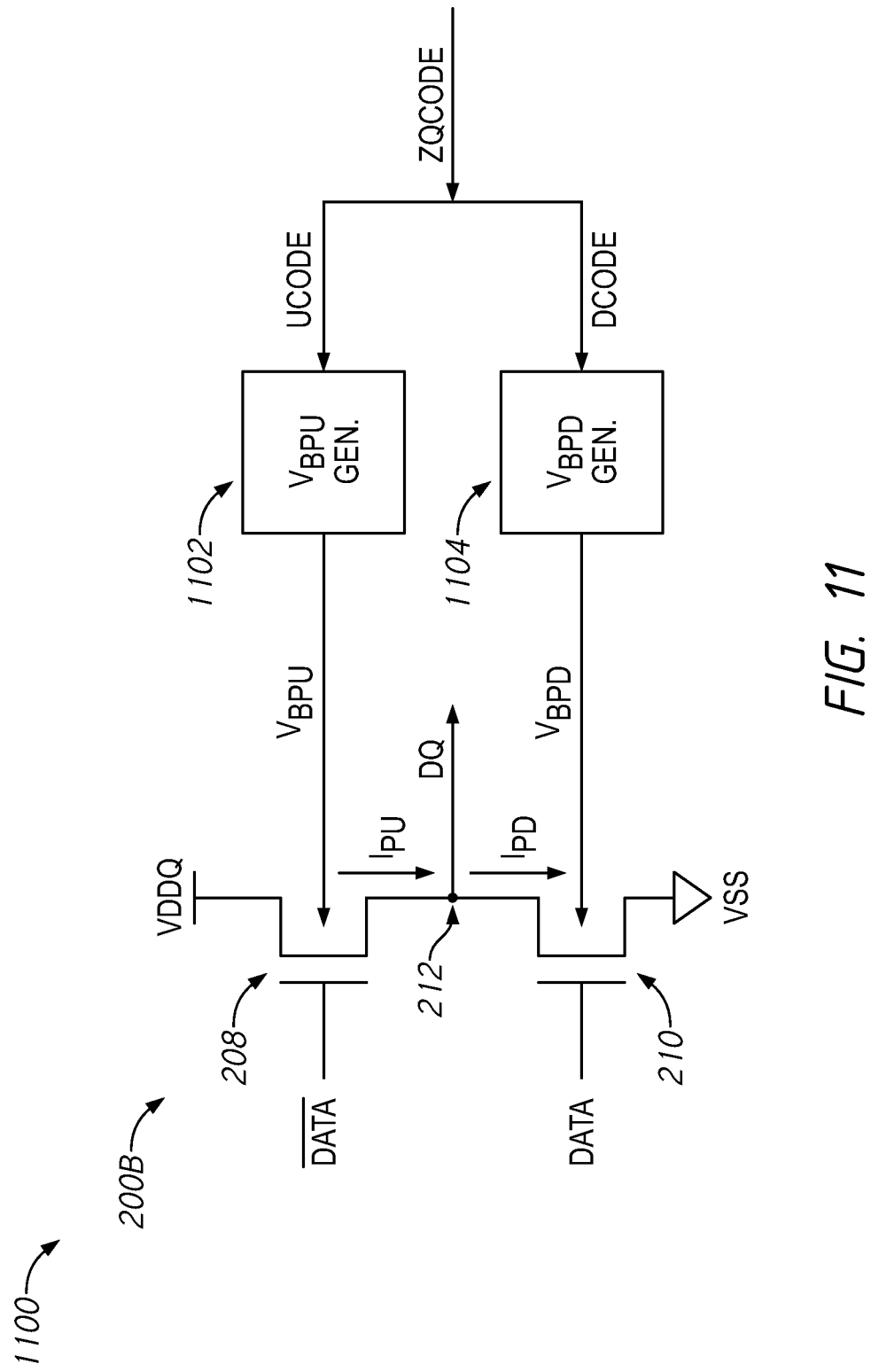
FIG. 11 illustrates a portion of an IO circuit according to at least one embodiment of the disclosure.

FIG. 11 illustrates a portion of an IO circuit according to at least one embodiment of the disclosure. The IO circuit 1100 may be included in IO circuit 460 in some embodiments. The 10 circuit 1100 may include the output driver 200B, also shown in FIG. 2B, and voltage generators 1102 and 1104. The IO circuit 1100 may receive a ZQCODE from a ZQ calibration circuit, such as ZQ calibration circuit 480, 500, 600, 700, and/or 800. The ZQCODE may include an UCODE and a DCODE. The voltage generator 1102 may receive the UCODE and provide a body voltage $V_{BPU}$ to the pull-up driver transistor 208 based on the UCODE. The voltage generator 1104 may receive the DCODE and provide a body voltage $V_{BPD}$ to the pull-down driver transistor 210 based on the DCODE. The body voltages provided by voltage generators 1102 and 1104 may allow drain currents $I_{PU}$ and $I_{PD}$ to approach or meet a specification and provide a desired (e.g., specified) impedance for a DQ terminal. Providing the desired impedance of a DQ terminal may facilitate impedance matching and improve signal integrity in some applications.

The apparatuses, systems, and methods disclosed herein may allow for impedance matching of external terminals without sets of resistances coupled by switches (e.g., transistors). This may reduce the size requirements of output drivers coupled to the external terminals. In some applications, the apparatuses, systems, and methods disclosed herein may be applied to output drivers including one or more resistors.

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

What is claimed is:

1. An apparatus, comprising:
   an external terminal;
   an output driver comprising a transistor coupled to the external terminal; and
   a voltage generator configured to apply a body voltage to the transistor, wherein the body voltage causes a drain current of the transistor to approach a specified value to provide a desired impedance at the external terminal.

2. The apparatus of claim 1, further comprising a calibration circuit configured to provide a multibit code, the calibration circuit comprising:
   a comparator configured to provide a comparison signal based on a comparison of a reference voltage and a voltage at a second external terminal; and
   a calibration logic circuit configured to provide a multibit code based, at least in part, on the comparison signal, wherein the body voltage provided by the voltage generator is based on the multibit code.

3. The apparatus of claim 2, wherein the calibration logic circuit comprises:
   an up/down counter circuit configured to increase the multibit code when the comparison signal is a first state and decrease the multibit code when the comparison signal is a second state; and
   a second voltage generator configured to provide a second body voltage to a second transistor of a model output driver coupled to the second external terminal, wherein the second body voltage is based on the multibit code.

4. The apparatus of claim 3, wherein the up/down counter circuit is configured to receive a clock signal and adjust the multibit code based on the comparison signal responsive to an edge of the clock signal.

5. The apparatus of claim 2, wherein the calibration circuit further comprises a code storage circuit configured to store the multibit code and provide the multi-bit code to the voltage generator.

6. The apparatus of claim 2, wherein the calibration circuit further comprises a model output driver comprising a second transistor, wherein the second transistor is configured to model the transistor of the output driver, and the second transistor is coupled to the second external terminal.

7. The apparatus of claim 2, wherein the comparator is a digital comparator.

8. The apparatus of claim 2, wherein the second external terminal is coupled to a resistance.

9. A system comprising:
   a host;
   a conductive line;
   a semiconductor device coupled to the host by the conductive line, the semiconductor device including a calibration circuit configured to set an impedance of an external terminal of the semiconductor device to a specified value, the calibration circuit comprising:
   a model pull-up driver comprising a first transistor,
   a model pull-down driver comprising a second transistor;
   a pull-up driver calibration circuit configured to determine a first body voltage to apply to the first transistor to set a first drain current to a first value; and
   a pull-down driver calibration circuit configured to determine a second body voltage to apply to the second transistor to set a second drain current to a second value, wherein the first and second drain currents cause the impedance to approach the specified value.

10. The system of claim 9, wherein the model pull-up driver or the model pull-down driver are coupled to the external terminal and the external terminal is coupled to an external resistance.

11. The system of claim 9, wherein the pull-up driver calibration circuit is configured to provide a first code based on the first body voltage and the pull-down driver calibration circuit is configured to provide a second code based on the second body voltage, and wherein the calibration circuit further comprises a code storage circuit configured to store the first code and the second code.

12. The system of claim 11, further comprising an input/output (IO) circuit comprising:
   a pull-up driver coupled to a second external terminal coupled to the conductive line;
   a pull-down driver coupled to the second external terminal;
   a first voltage generator configured to receive the first code from the code storage circuit and provide the first body voltage to a third transistor of the pull-up driver; and
   a second voltage generator configured to receive the second code from the code storage circuit and provide the second body voltage to a fourth transistor of the pull-down driver.

13. The system of claim 11, wherein the pull-up driver calibration circuit comprises:
   a comparator configured to compare a voltage at a second external terminal coupled to the first transistor and a reference voltage and provide a comparison signal;
   an up/down counter configured to adjust the first code based on the comparison signal; and
   a voltage generator configured to provide a body voltage to the first transistor, wherein the body voltage is based on the first code.

14. The system of claim 13, wherein the first code is a multi-bit code, wherein a number of bits of the multibit code is based, at least in part, on a number of different voltages the voltage generator generates for the body voltage.

15. A method comprising:
   providing a comparison signal based on a comparison of a reference voltage and a voltage of an external terminal;
   adjusting a count value based, at least in part, on the comparison signal; and
   applying a body voltage to a transistor coupled to the external terminal, wherein a value of the body voltage is based, at least in part, on the count value, wherein the count value is adjusted to cause the voltage of the external terminal to approach the reference voltage.

16. The method of claim 15, further comprising receiving a clock signal, wherein the adjusting the count value is responsive to an edge of the clock signal.

17. The method of claim 16, wherein the edge is a rising edge or a falling edge.

18. The method of claim 16, further comprising repeating the method of claim 15 for a number of clock cycles based on the clock signal.

19. The method of claim 15, further comprising:
   detecting a toggling of the count value between two values;
   setting the count value to one of the two values; and
   stopping the adjusting of the count value.

20. The method of claim 15, wherein the providing, adjusting, and applying are performed responsive to a calibration command received at a semiconductor device.

* * * * *